(12) United States Patent
Holden et al.

(10) Patent No.: US 6,631,265 B2
(45) Date of Patent: *Oct. 7, 2003

(54) APPARATUS AND METHODS FOR TUNING BANDPASS FILTERS

(75) Inventors: Alan R. Holden, Apex, NC (US); Antonio Montalvo, Raleigh, NC (US); Richard H. Myers, Raleigh, NC (US)

(73) Assignee: Ericsson Inc., Research Triangle Park, NC (US)

( * ) Notice: Subject to any disclaimer, the term of this patent is extended or adjusted under 35 U.S.C. 154(b) by 13 days.

This patent is subject to a terminal disclaimer.

(21) Appl. No.: 09/742,704

(22) Filed: Dec. 20, 2000

(65) Prior Publication Data

US 2001/0001759 A1 May 24, 2001

Related U.S. Application Data

(63) Continuation of application No. 09/018,513, filed on Feb. 4, 1998.

(51) Int. Cl.[7] .................................................. H04B 1/16
(52) U.S. Cl. ..................... 455/439; 455/340; 455/125
(58) Field of Search ................................ 455/339, 340, 455/226.1, 67.1, 423, 77, 125, 150.1

(56) References Cited

U.S. PATENT DOCUMENTS

| 4,232,398 A | 11/1980 | Gould et al. ............. 455/226.3 |
| 4,531,148 A | * 7/1985 | Ohta et al. ................... 455/340 |

(List continued on next page.)

FOREIGN PATENT DOCUMENTS

| DE | 195 40 139 A | 4/1997 |
| EP | 0 003 634 A | 8/1979 |
| EP | 0 726 652 A | 8/1996 |
| WO | WO 90/15339 | 12/1990 |

OTHER PUBLICATIONS

Schaumann et al., "The Problem of On–Chip Automatic Tuning in Continuous–time Integrated Filters", Reprinted from IEEE Proc. ISCAS, 1989, pp. 106–109.

(List continued on next page.)

Primary Examiner—Duc Nguyen
(74) Attorney, Agent, or Firm—Myers Bigel Sibley & Sajovec

(57) ABSTRACT

A signal having a substantially uniform spectral distribution, e.g., a flat noise signal such as a signal ground, is provided at the input of a bandpass filter such as an IF filter of a receiver circuit, to thereby produce an output signal at the output of the bandpass filter. The output signal is processed in a limiter to produce a limited signal. An average frequency of the limited signal is determined, and the bandpass filter is adjusted based on the determined average frequency. According to one embodiment of the present invention, the bandpass filter comprises a Gm-C filter having a transconductance, and the filter is adjusted by adjusting the transconductance of the Gm-C filter based on the determined average frequency. According to another aspect of the present invention, a desired center frequency for the bandpass filter is identified. A resolution and a desired confidence interval are also identified. The number of samples of the limited signal needed to achieve the identified desired resolution and confidence interval is determined based on the identified desired center frequency. An average frequency is determined by sampling the limited signal to obtain a plurality of samples, the number of the plurality of samples being at least as great as the determined number of samples of the limited signal to achieve the identified desired resolution and confidence level, and determining the average frequency from the plurality of samples. The bandpass filter is adjusted based on the determined average frequency to achieve a center frequency for the bandpass filter that is within a predetermined range with respect to the desired center frequency. Related apparatus are also discussed.

30 Claims, 3 Drawing Sheets

U.S. PATENT DOCUMENTS

| | | | |
|---|---|---|---|
| 4,621,645 A | 11/1986 | Flax | 128/660 |
| 4,731,872 A | 3/1988 | Washburn, Jr. | 455/210 |
| 5,404,589 A | 4/1995 | Bijker et al. | 455/200.1 |
| 5,408,196 A * | 4/1995 | Sempel et al. | 329/325 |
| 5,440,264 A | 8/1995 | Sevenhans et al. | 327/553 |
| 5,471,168 A | 11/1995 | Sevenhans et al. | 327/553 |
| 5,661,432 A | 8/1997 | Chang et al. | 327/552 |
| 5,666,083 A | 9/1997 | Myers et al. | 327/553 |
| 5,926,752 A | 7/1999 | Lin | 455/323 |
| 5,945,889 A | 8/1999 | Shanthi-Pavan et al. | 455/125 |

OTHER PUBLICATIONS

Plett et al., "*Continuous Time Filters Using Open Loop Tuneable Transconductance Amplifiers*", Reprinted from IEEE Proc. ISCAS, 1986, pp. 1173–1176.

International Search Report, PCT/US99/02424, Jun. 4, 199.

* cited by examiner

APPARATUS AND METHODS FOR TUNING BANDPASS FILTERS

This application is a continuation of prior application Ser. No. 09/018,513, filed Feb. 4, 1998, the disclosure of which is hereby incorporated herein by reference.

FIELD OF THE INVENTION

The present invention relates to electronic circuits and methods of operation thereof, and more particularly, to filter circuits and methods of operation thereof.

BACKGROUND OF THE INVENTION

Traditional superheterodyne radio receiver designs typically use passive intermediate frequency (IF) filters. In many advanced receiver circuit designs, in particular, receiver designs implemented using application specific integrated circuits (ASICs), passive filters have been replaced with active filters that typically are more easily implemented in an ASIC. An active filter structure commonly used in ASIC-based IF circuits is the so-called "Gm-C" filter, which uses transconductance amplifiers and capacitor gyrators to simulate inductors.

The transconductance and capacitance of an integrated circuit Gm-C IF filter can vary with fabrication process conditions. Variations in temperature and power supply voltage can also cause variation of the transfer characteristics of the filter, which may require periodic re-tuning to maintain the passband shape and center frequency. Traditional approaches to tuning Gm-C filters include master-slave tuning techniques, as described in "The Problem of On-Chip Automatic Tuning in Continuous-Time Integrated Filters," Schauman et al., *IEEE Proceedings of ISCAS*, pp. 106–109, 1989. According to this type of approach, a duplicate (master) filter is formed on the same chip with the IF filter. A reference signal is applied to the duplicate filter to determine its transfer characteristics, and the IF (slave) filter is adjusted accordingly based on the assumption that the characteristics of the master and slave filters are closely matched.

The conventional master/slave tuning technique can be disadvantageous for a number of reasons. To achieve accurate tuning, the components of the master and slave filters generally must be very closely matched. In addition, the additional master filter generally consumes chip area that could be better utilized for other circuitry. Accordingly, there is a need for improved tuning methods and apparatus for tuning receiver filter circuits.

SUMMARY OF THE INVENTION

In light of the foregoing, it is an object of the present invention to provide improved methods and apparatus for tuning bandpass filters such as the IF filters employed in a radio communications circuit.

It is another object of the present invention to provide improved methods and apparatus for tuning bandpass filters that can be implemented using fewer components than conventional techniques.

It is yet another object of the present invention to provide improved methods and apparatus for tuning an IF filter in a radio receiver circuit which can be implemented using existing components of the radio receiver circuit.

These and other objects, features and advantages are provided according to the present invention by methods and apparatus in which a bandpass filter, such as an IF filter of a radio receiver circuit, is tuned by providing a signal having a substantially uniform spectral distribution to the input of the filter, determining an average frequency for a limited signal produced by a limiter following the filter, and adjusting the filter based on the determined average frequency. A sampling interval may be determined based on the desired center frequency for the filter and a desired confidence interval, and the limited signal sampled for the desired sampling interval to achieve a plurality of samples from which an average frequency can be determined. The samples may be obtained by processing the limited signal using a detector included in the receiver circuit. The filter may be Gm-C filter that has a transconductance which is adjustable responsive to a control signal applied to the filter. The control signal may be produced based on the determined average frequency. The filter may be adjusted based on the determined average frequency until a center frequency is achieved which is within a predetermined range with respect to a desired center frequency.

The present invention arises from the realization that in applying a spectrally uniform signal to the input of the bandpass filter, it can be expected that the limited signal produced by the limiter will have a spectrum which has an approximately Gaussian distribution around the center frequency of the bandpass filter. Accordingly, by sampling the limited signal and determining an average frequency thereof, an estimate of the center frequency of the bandpass filter can be obtained with a desired resolution and confidence level. Because the limiter and detector are components normally present in the radio receiver circuit, additional circuitry, such as a master reference filter matched to the bandpass filter, is not required. As the bandpass filter can otherwise be designed such that the passband shape is resistant to variations due to temperature and power supply fluctuations, tuning of the center frequency of the bandpass filter can be performed upon power-up of the receiver circuit.

In particular, according to the present invention, a signal having a substantially uniform spectral distribution is provided at the input of a bandpass filter to thereby produce an output signal at the output of the bandpass filter. The output signal is processed in a limiter to produce a limited signal. An average frequency of the limited signal is determined, and the bandpass filter is adjusted based on the determined average frequency. According to one embodiment of the present invention, the bandpass filter comprises a Gm-C filter having a transconductance, and the filter is adjusted by adjusting the transconductance of the Gm-C filter based on the determined average frequency.

According to another aspect of the present invention, a desired center frequency for the bandpass filter is identified. A resolution and a desired confidence interval are also identified. The number of samples of the limited signal needed to achieve the identified desired resolution and confidence interval is determined based on the identified desired center frequency. An average frequency is determined by sampling the limited signal to obtain a plurality of samples, the number of the plurality of samples being at least as great as the determined number of samples of the limited signal to achieve the identified desired resolution and confidence level, and determining the average frequency from the plurality of samples. The bandpass filter is adjusted based on the determined average frequency to achieve a center frequency for the bandpass filter that is within a predetermined range with respect to the desired center frequency. The sampling, determining, and adjusting steps may be repeatedly performed until the average frequency is within a predetermined range with respect to the desired center frequency.

According to another aspect of the present invention, an IF filter of a radio receiver circuit is tuned. The radio receiver circuit includes a limiter connected to an output of the IF filter. A signal having a substantially uniform spectral distribution is provided at an input of the IF filter to thereby produce an output signal at the output of the IF filter. The output signal is processed in the limiter to produce a limited signal. An average frequency of the limited signal is determined, and the IF filter is adjusted based on the determined average frequency. The IF filter may include a Gm-C filter having a transconductance, and adjustment of the filter may comprise adjusting the transconductance of the Gm-C filter according to the determined average frequency.

According to another aspect of the present invention, the IF filter has a passband within a range of frequencies. A noise signal having a substantially uniform spectral distribution within the range of frequencies is provided to the input of the IF filter. For example, the IF filter may be implemented in a circuit having a signal ground, and the radio receiver circuit may be configured to connect the input of the IF filter to one of a radio signal path or the signal ground. The noise signal may be provided by connecting the signal ground to the input of the IF filter. According to another related aspect, connection of the signal ground occurs in response to application of power to the radio receiver circuit. After adjustment of the IF filter, the input of the IF filter may be disconnected from the signal ground and the IF filter connected to a radio signal path.

An apparatus according to an embodiment of the present invention includes a bandpass filter including an input and an output. A signal generator provides a signal having a substantially uniform spectral distribution at the input of the bandpass filter to thereby produce an output signal at the output of the bandpass filter. A limiter is responsive to the bandpass filter and processes the output signal of the bandpass filter to produce a limited signal. Means are provided, responsive to the limiter, for determining an average frequency of the limited signal. Additional means are provided, responsive to the means for determining an average frequency, for adjusting the bandpass filter based on the determined average frequency.

In yet another embodiment according to the present invention, a radio receiver circuit includes an IF filter having an input and an output. Means are provided for providing a signal having a substantially uniform spectral distribution at the input of the IF filter to thereby produce an output signal at the output of the IF filter. A limiter is connected to the output of the IF filter, and limits the output signal to produce a limited signal. Means are responsive to the limiter for determining an average frequency of the limited signal. The means for determining an average frequency may include a detector, a digital signal processor (DSP) and a microcontroller as may be commonly found in a cellular radiotelephone receiver circuit, for example. Additional means are provided, responsive to the means for determining an average frequency, for adjusting the IF filter based on the determined average frequency. For example, the IF filter may include a Gm-C (transconductance) filter which is responsive to a control signal applied thereto, and the means for adjusting the IF filter may comprise means for generating the control signal. A receiver circuit that is tunable using commonly used receiver components is thereby provided.

DETAILED DESCRIPTION OF PREFERRED EMBODIMENTS

Figure 1:
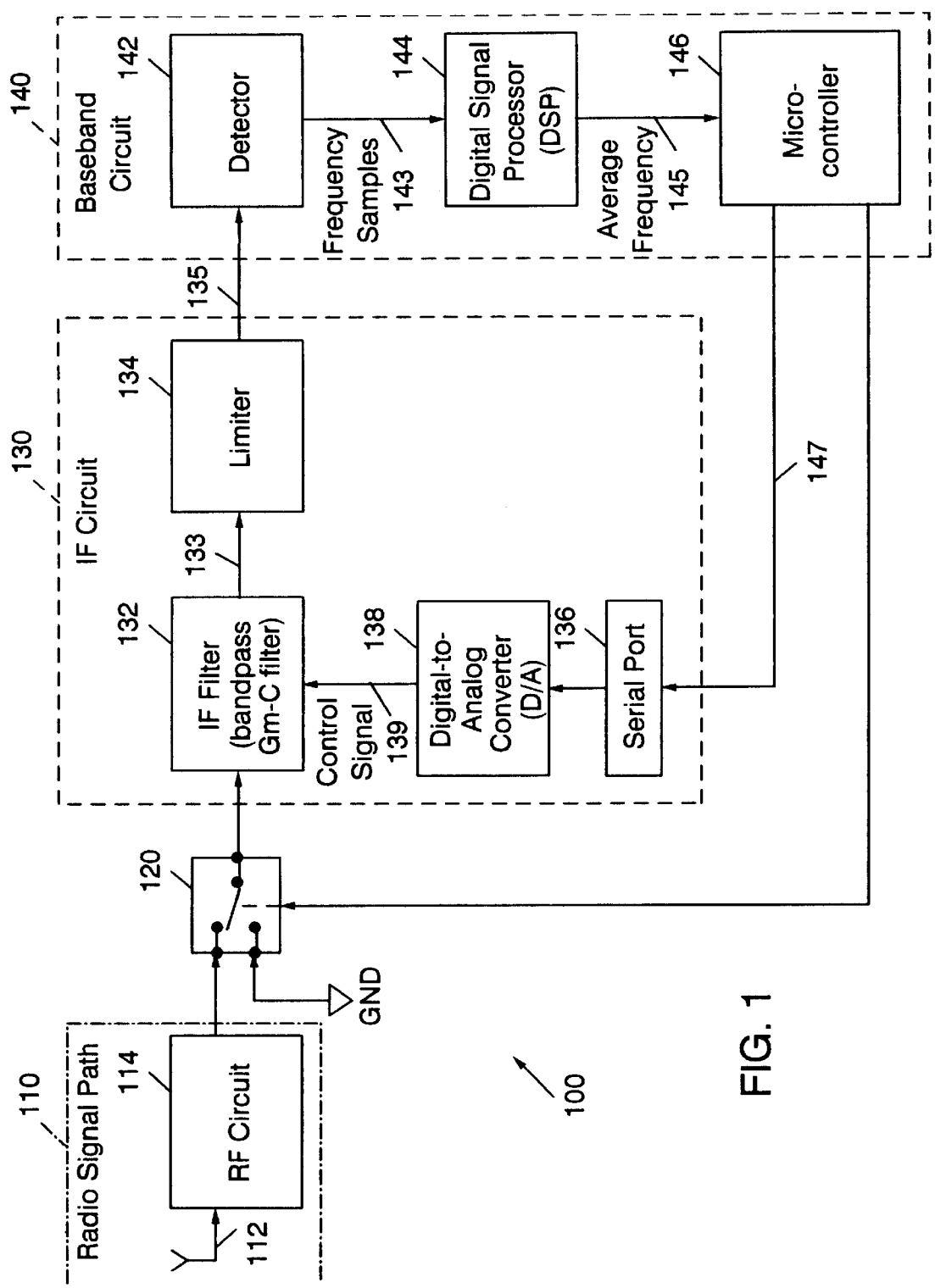
FIG. 1 is a schematic diagram illustrating a radio receiver circuit according to an embodiment of the present invention.

The present invention now will be described more fully hereinafter with reference to the accompanying drawings, in which embodiments of the invention are shown. Those skilled in the art will appreciate that the invention may be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

For purposes of the discussion herein, descriptions of preferred embodiments utilizing Gm-C (transconductance) bandpass filters are provided. Those skilled in the art will appreciate, however, that the present invention need not be limited to Gm-C filters. It will be understood that in general, bandpass filters that have transfer characteristics that are adjustable may be used with the present invention.

Gm-C filters typically have a transfer characteristic that is adjustable by varying the transconductance of the filter. This may be accomplished in a number of ways, as transconductance amplifiers may have a wide variety of configurations. In a typical transconductance filter, for example, the center frequency of the filter passband is dependent on the ratio of the transconductance and the capacitance of the filter. A well-known technique for adjusting the transconductance of such a transconductance filter is to vary an externally-applied control signal to control a biasing point, as described in "Continuous Time Filters Using Open Loop Tuneable Transconductance Amplifiers," by C. Plett et al., IEEE Proc. ISCAS, pp. 1173–1176 (1986).

The present invention arises from the realization that the signal processing capabilities of limiters and detectors such as those commonly employed in radio receiver circuits may be used to determine transfer characteristics of a bandpass filter such as an IF filter without requiring extensive additional circuitry. A signal having a substantially uniform spectral distribution, e.g., a noise signal that has substantially flat spectral distribution within the nominal passband of the bandpass filter, is provided to a bandpass filter. According to aspects of the present invention, the output signal produced by the filter is processed in a limiter, and an average frequency is estimated for the limited signal. The estimated average frequency may then be used to adjust a transfer characteristic of the filter, e.g., to adjust the filter's center frequency.

According to a theoretical explanation which in no way limits the scope of the present invention, if a spectrally uniform signal is provided to a bandpass filter, the noise spectrum produced by the filter should approximate the filter's gain response, i.e., the largest amplitude components should occur in a frequency range corresponding to the filter's passband. The noise spectrum produced by the limiter should be similar, i.e., the frequency information should be preserved. Frequency samples can be conveniently obtained from the limited signal, and integrated for a predetermined time to obtain a measure of the filter's average frequency, i.e., an estimate of its center frequency.

The integration time can be found using statistical methods in order to gain a certain confidence that the calculated center frequency is within a desired tolerance of the actual center frequency of the filter. Assuming the limited signal has a Gaussian distribution, a confidence interval for estimating the center frequency of the bandpass filter may be determined. For example, for a 5σ confidence interval, 0.9999994 is the probability that the average frequency determined from the limited signal is the center frequency of the bandpass filter:

$$5\sigma = \frac{f_d}{\sqrt{2}},$$

and thus $$\sigma = \frac{f_d}{5\sqrt{2}},$$

where $f_d$ is the desired frequency resolution. The average frequency $F_c$ of the limited signal may be computed as:

$$F_c = \frac{1}{N}\sum_{n=1}^{N} F_n,$$

where N represents the number of frequency samples $F_n$. To achieve a given σ, the number of samples N is given by:

$$N = \left(\frac{BW_{rms}}{2\sigma}\right)^2,$$

where $BW_{rms}$ is the rms bandwidth of the system. The minimum sampling interval $T_S$ needed to produce the number of samples to achieve the desired confidence level is given by:

$$T_s = \frac{N}{f_{min}},$$

where $f_{min}$ is the lowest center frequency at which the bandpass filter can reside.

For example, for a system with a bandwidth of 30 kHz ($BW_{rms}$=21.213 kHz), a desired frequency resolution of 500 Hz, a lowest center frequency $f_{min}$ of 70 kHz and a 5σ confidence level:

$$\sigma = \frac{500}{5\sqrt{2}} = 70.7 \text{ Hz},$$

$$N = \left(\frac{21.213 \times 10^3}{2 \times 70.7}\right)^2 = 22507 \text{ samples, and}$$

$$T_s = \frac{22507}{70 \text{ kHz}} = 0.3125 \text{ seconds}.$$

Accordingly, for this example, if 22507 samples are obtained over a sampling interval of 0.3125 seconds, assuming Gaussian noise at the output of the limiter, the average frequency calculated from the samples will be within ±500 Hz of the actual center frequency of the bandpass filter to a probability of approximately 99.99994%. It will be understood that if less resolution is desired, the number of samples and the sampling interval can be reduced.

FIG. 1 illustrates a radio receiver circuit 100 for receiving and processing radio signals according to an embodiment of the present invention. The receiver circuit 100 includes a radio signal path 110 including an antenna 112 and a radio frequency (RF) circuit 114. The RF circuit 114 is connected to the input of an intermediate frequency (IF) bandpass filter 132 of an IF circuit 130 via a switch 120. The switch 120 provides means for connecting one of the radio signal path 110 or a signal ground GND (or other signal having a substantially uniform spectral distribution) to the input of the IF filter 132. The IF circuit 130 also includes a limiter 134, which processes signals produced by the IF filter 132 to produce a limited signal 135. The limited signal 135 is passed to a detector 142 of a baseband circuit 140. The baseband circuit 140 also includes a digital signal processor (DSP) 144 and a microcontroller 146 for processing, for example, frequency or phase samples produced by the detector 142. The detector 142 may, for example, generate frequency samples 143 by detecting zero crossings of the limited signal 135, determining time intervals between successive zero crossings, and computing frequency samples based on the determined time intervals.

Those skilled in the art will recognize that the configuration of the radio receiver circuit 100 illustrated in FIG. 1 resembles that of a radio receiver circuit as is typically utilized, for example, in a cellular radiotelephone. According to aspects of the present invention, the IF filter 132 of the IF circuit 130 is adjustable responsive to a control signal 139 produced by a digital-to-analog (D/A) converter 138. The control signal 139 is generated by the D/A converter 138 responsive to a digital output 147 received from the microcontroller 146 via a serial port 136. The digital output 147 is derived from an average frequency 145 for the limited signal 135, as determined by the DSP 144 based on frequency samples 143 produced by the detector 142. Accordingly, standard radio receiver circuit hardware may be used to implement apparatus and methods according to the present invention.

Figure 2:
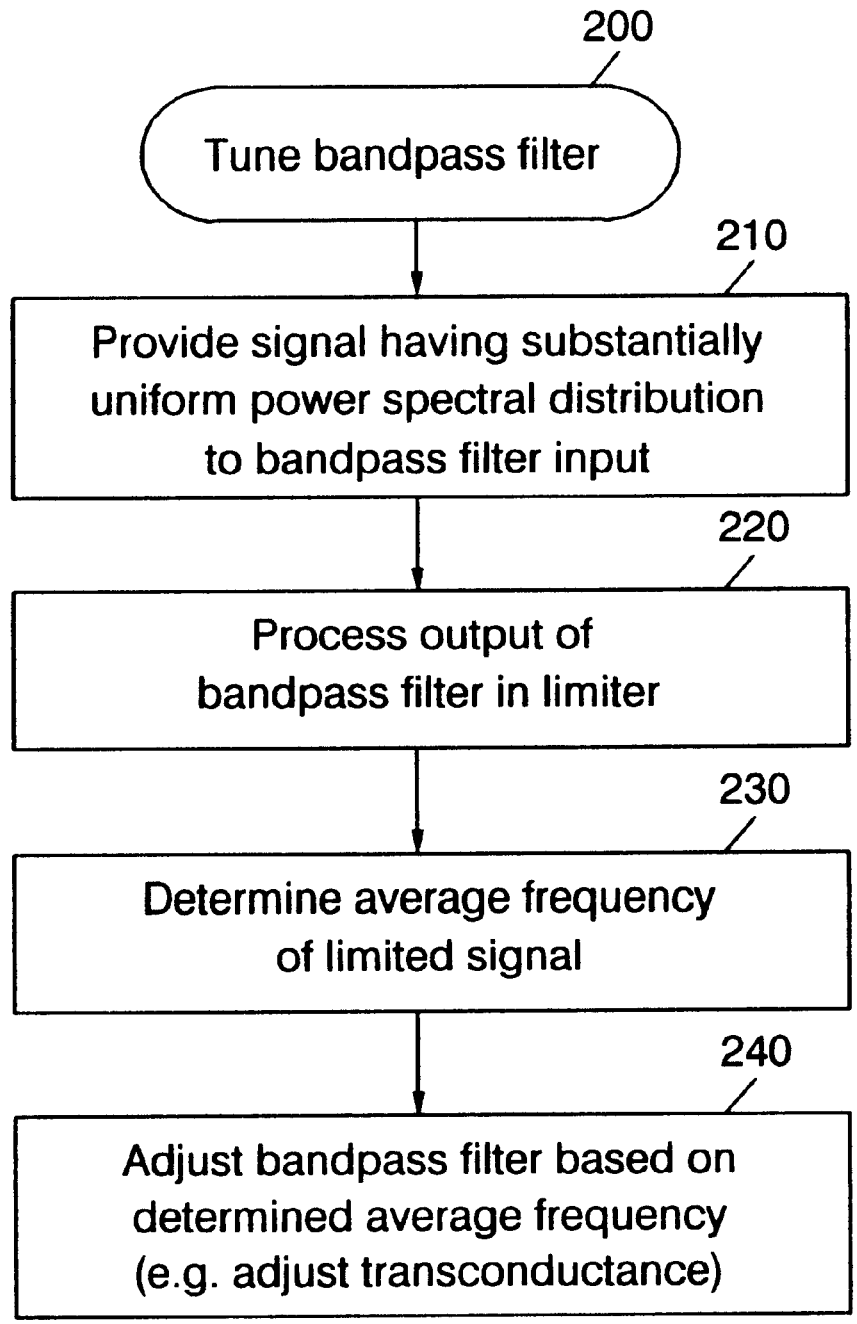
FIG. 2 is a flowchart illustration of operations for tuning a bandpass filter according to an aspect of the present invention.
Figure 3:
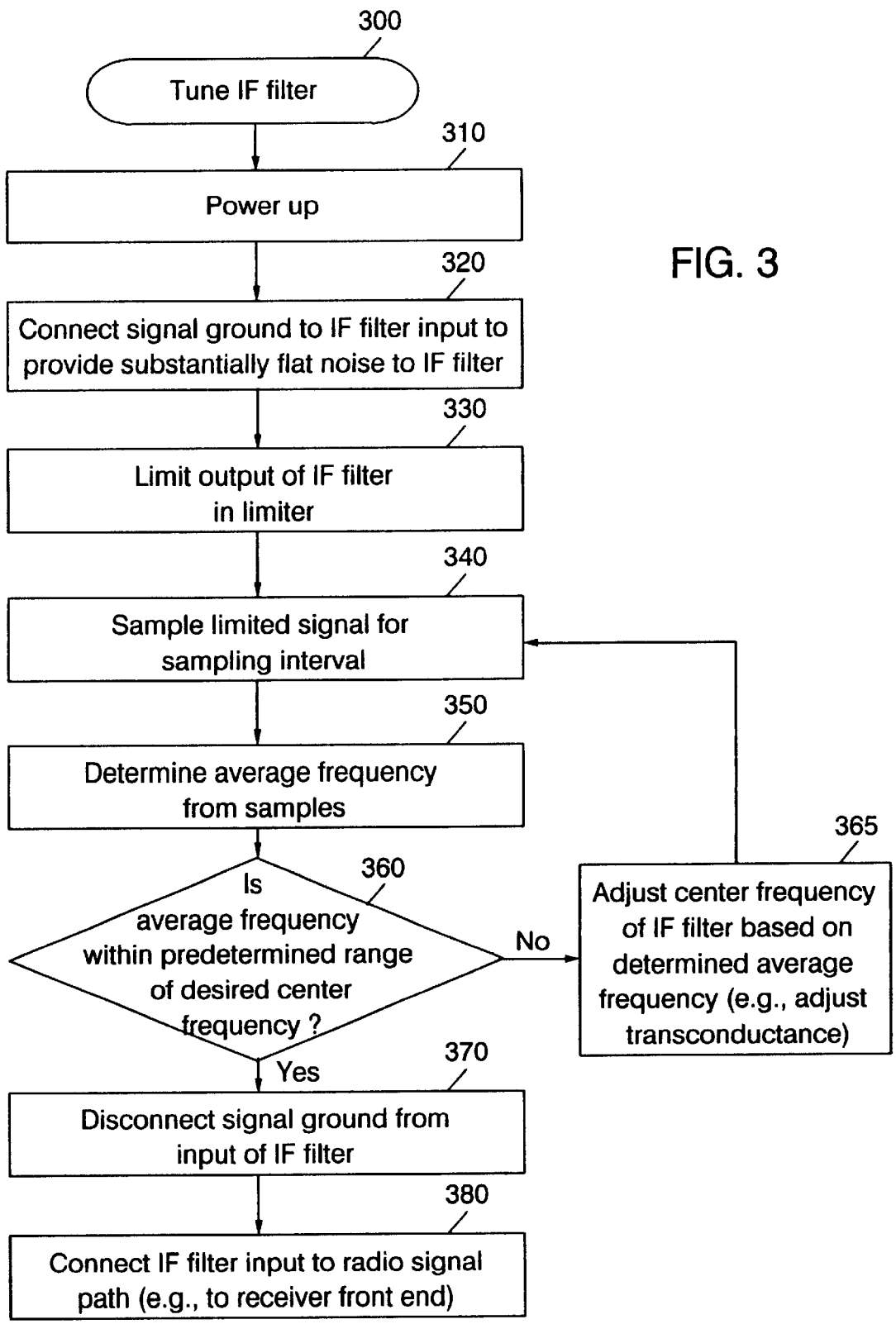
FIG. 3 is a flowchart illustration of operations for tuning an intermediate frequency (IF) filter in a radio receiver circuit according to an aspect of the present invention.

The flowchart illustrations of FIGS. 2 and 3 illustrate, respectively, basic operations for tuning a bandpass filter according to a first embodiment of the present invention, and detailed operations for tuning an IF bandpass filter in a radio receiver circuit according to second embodiment of the present invention. It will be understood that blocks of the flowchart illustrations, and combinations of blocks in the flowchart illustration, can be implemented by computer program instructions which may be loaded onto a computer or other programmable data processing apparatus to produce a machine such that the instructions which execute on the computer or other programmable data processing apparatus create means for implementing the functions specified in the flowchart block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus to provide steps for implementing the functions specified in the flowchart block or blocks. Accordingly, blocks of the flowchart illustrations support combinations of means for performing the specified functions and combinations of steps for performing the specified functions. It will also be understood that each block of the flowchart illustrations, and combinations of blocks in the flowchart illustrations, can be implemented by special purpose hardware which performs the specified functions or steps, or combinations of special purpose hardware such as microprocessors, digital signal processing (DSP) chips, application-specific integrated circuits (ASICS) or the like (such as the DSP 144 and the microcontroller 146 of FIG. 1) which execute computer instructions.

Referring to FIG. 2, operations (Block 200 et seq.) for tuning a bandpass filter include providing a signal having a substantially uniform spectral distribution, such as a flat noise signal, to the input of the bandpass filter (Block 210). The output of the bandpass filter is then processed in a limiter to produce a limited signal (Block 220). An average frequency is determined for the limited signal (Block 230). The bandpass filter is then adjusted, e.g., the center frequency of the bandpass filter is adjusted based on the determined average frequency (Block 240). For example, where the bandpass filter is a transconductance filter, the center frequency may be adjusted by adjusting the transconductance of the filter based on the determined average frequency.

Referring now to FIG. 3, operations (Block 300 et seq.) for tuning an IF filter in a radio receiver circuit include powering up the radio receiver circuit (Block 310). In response to power up, a signal ground is connected to the input of the IF filter (Block 320) to provide substantially flat noise thereto. The resulting output of the IF filter is then processed in a limiter (Block 330). The limited signal is sampled for a sampling interval to produce a plurality of frequency samples (Block 340), and an average frequency is determined from the samples (Block 350). If the determined average frequency is not within a predetermined range of the desired center frequency for the IF filter, the center frequency of the IF filter is adjusted, e.g., by adjusting the transconductance of a Gm-C filter, and a new average frequency is determined (Blocks 360, 365, 340, 350). If the determined average frequency is within the predetermined range, the signal ground is then disconnected from the input of the IF filter, and the input of the IF filter is connected to a radio signal path, e.g., to the receiver front end (Blocks 360, 370, 380).

With reference to FIG. 1, to adjust the filter, computing means such as the microcontroller 146 of FIG. 1 may generate a digital output to adjust the center frequency of the bandpass filter based on the determined average frequency. The digital word is in turn converted into the biasing control signal applied to adjust the center frequency of the filter, e.g., by adjusting the filter transconductance. The appropriate digital output may be determined based on a known relationship between the center frequency of the filter and the biasing control signal applied thereto. Typical relationships between biasing signals and transconductance in a transconductance filter are described in the aforementioned article by Plett et al.

It will be appreciated that numerous variations on the above-described operations may be performed that are within the scope of the present invention. For example, instead of performing adjustment of the IF filter in response to powerup, the above-described adjustment procedures may be performed periodically, in response to mode changes in the receiver circuit, and the like. Similarly, in cases where the bandpass (e.g., IF) filter is implemented using a structure other than a Gm-C filter, adjustment of the filter may occur by other means than by changing transconductance.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of tuning a bandpass filter having an input and an output, the method comprising the steps of:
   providing a wideband signal at the input of the bandpass filter to thereby produce an output signal at the output of the bandpass filter;
   processing the output signal in a limiter to produce a limited signal;
   determining an average frequency of the limited signal; and
   adjusting the bandpass filter based on the determined average frequency of the limited signal.

2. A method according to claim 1:
   wherein the step of determining an average frequency of the limited signal is preceded by:
      identifying a desired center frequency for the bandpass filter;
      identifying a desired resolution and a desired confidence interval; and
      determining a number of samples of the limited signal to achieve the identified desired resolution and confidence interval based on the identified desired center frequency;
   wherein the step of determining an average frequency of the limited signal comprises:
      sampling the limited signal to obtain a plurality of samples, the number of the plurality of samples being at least as great as the determined number of samples of the limited signal to achieve the identified desired confidence level; and
      determining an average frequency of the limited signal from the plurality of samples; and
   wherein the step of adjusting comprises adjusting the bandpass filter based on the determined average frequency of the limited signal.

3. A method according to claim 2, wherein the steps of sampling, determining an average frequency of the limited signal from the plurality of samples, and adjusting the bandpass filter of the limited signal are repeatedly performed until the average frequency of the limited signal is within a predetermined range with respect to the desired center frequency.

4. A method according to claim 2:
   wherein the step of sampling is preceded by determining a sampling interval based on the determined number of samples of the limited signal to achieve the identified resolution and confidence interval; and
   wherein the step of sampling comprises sampling the limited signal over the determined sampling interval to obtain the plurality of samples.

5. A method according to claim 4, wherein the step of determining an average frequency of the limited signal from the plurality of samples comprises:
   detecting a plurality of zero crossings of the limited signal occurring during the sampling interval; and
   determining an average frequency of the limited signal from the detected plurality of zero crossings.

6. A method according to claim 1, wherein the bandpass filter has a which falls within a range of frequencies, and wherein the step of providing passband a wideband signal comprises providing a signal having a substantially uniform spectral distribution within the range of frequencies.

7. A method according to claim 1, wherein the bandpass filter is implemented in a circuit having a signal ground, and wherein the step of providing a wideband signal comprises connecting the signal ground to the input of the bandpass filter.

8. A method according to claim 1, wherein the bandpass filter is an IF filter of a radio receiver circuit.

9. A method according to claim 8, wherein the IF filter is implemented in a circuit having a signal ground, wherein the radio receiver circuit is configured to connect the input of the IF filter to one of a radio signal path or the signal ground, and wherein the step of providing a wideband signal comprises connecting the signal ground to the input of the IF filter.

10. A method according to claim 9:
wherein the step of connecting the signal ground is preceded by applying power to the radio receiver circuit;
wherein the step of connecting the signal ground comprises connecting the signal ground to the input of the IF filter in response to application of power to the radio receiver circuit.

11. A method according to claim 10, wherein the step of adjusting the bandpass filter is followed by:
disconnecting the input of the IF filter from the signal ground; and
connecting the input of the IF filter to the radio signal path.

12. A method according to claim 8, wherein the radio receiver circuit further includes a detector connected to an output of the limiter and operative to produce frequency samples of signals produced by the limiter, and wherein the step of determining an average frequency of the limited signal comprises obtaining a frequency sample of the limited signal from the detector.

13. A method according to claim 1, wherein the bandpass filter comprises a Gm-C filter having a transconductance, and wherein the step of adjusting comprises adjusting the transconductance of the Gm-C filter based on the determined average frequency.

14. An apparatus for adjusting a bandpass filter including an input and an output, the apparatus comprising:
a signal generator which provides a wideband signal at the input of the bandpass filter to thereby produce an output signal at the output of the bandpass filter;
a limiter which processes the output signal of the bandpass filter to produce a limited signal;
means for determining an average frequency of the limited signal; and
means for adjusting the bandpass filter based on the determined average frequency of the limited signal.

15. An apparatus according to claim 14, further comprising:
means for identifying a desired center frequency for the bandpass filter;
means for identifying a desired resolution and a desired confidence interval; and
means, responsive to the means for identifying a desired center frequency and to the means for identifying a desired resolution and confidence interval, for determining a number of samples of the limited signal to achieve the identified desired resolution and confidence interval based on the identified desired center frequency; and
wherein the means for determining an average frequency of the limited signal comprises:
means, responsive to the limiter, for sampling the limited signal to obtain a plurality of samples from the limited signal, the number of the plurality of samples being at least as great as the determined number of samples of the limited signal to achieve the identified desired confidence level; and
means, responsive to the sampling means, for determining an average frequency of the limited signal from the plurality of samples; and wherein the means for adjusting comprises means for adjusting the bandpass filter based on the determined average frequency of the limited signal.

16. An apparatus according to claim 15, further comprising means, responsive to the means for identifying a desired center frequency and to the means for identifying a desired resolution and confidence interval, for determining a sampling interval based on the determined number of samples of the limited signal to achieve the identified resolution and confidence interval; and
wherein the sampling means comprises means for sampling the limited signal over the determined sampling interval to obtain the plurality of samples.

17. An apparatus according to claim 15, wherein the means for determining an average frequency of the limited signal from the plurality of samples comprises:
means, responsive to the limiter, for detecting a plurality of zero crossings of the limited signal occurring during the sampling interval; and
means, responsive to the means for detecting a plurality of zero crossings, for determining an average frequency of the limited signal from the detected plurality of zero crossings.

18. An apparatus according to claim 14, wherein the bandpass filter has a passband which falls within a range of frequencies, and wherein the means for providing a wideband signal comprises means for providing a signal having a substantially uniform spectral distribution within the range of frequencies.

19. An apparatus according to claim 18, wherein the bandpass filter is implemented in a circuit having a signal ground, and wherein the means for providing a wideband signal comprises means for connecting the signal ground to the input of the bandpass filter.

20. An apparatus according to claim 14, wherein the bandpass filter is an IF filter of a radio receiver circuit.

21. An apparatus according to claim 20, wherein the means for providing a wideband signal comprises means for connecting a signal ground to the input of the IF filter in response to application of power to the radio receiver circuit.

22. An apparatus according to claim 21, further comprising means for disconnecting the signal ground from the input of the IF filter and for connecting the input of the IF filter to a radio signal path after adjustment of the IF filter.

23. An apparatus according to claim 14, wherein the bandpass filter comprises a Gm-C filter having a transconductance, and wherein the means for adjusting comprises means for adjusting the transconductance of the Gm-C filter based on the determined average frequency.

24. An apparatus according to claim 23, wherein the transconductance is adjustable responsive to a control signal applied to the bandpass filter, and wherein the means for adjusting comprises means for generating the control signal based on the determined average frequency.

25. A receiver apparatus, comprising:
a bandpass filter including an input and an output and adjustable responsive to a control signal;
a signal generator which provides a broadband signal at the input of the bandpass filter to thereby produce an output signal at the output of the bandpass filter; and
a filter adjustment circuit, coupled to the output of the bandpass filter, that processes the output signal produced by the bandpass filter to produce a limited signal, that determines an average frequency of the limited signal, and that generates the control signal responsive to the determined average frequency of the limited signal.

26. An apparatus according to claim 25, wherein the filter adjustment circuit comprises a limiter which processes the output signal produced by the bandpass filter to produce the limited signal.

27. An apparatus according to claim 26, wherein the filter adjustment circuit comprises:

a sampler circuit operative to sample the limited signal to obtain a plurality of samples from the limited signal, the number of the plurality of samples being at least as great as a number of samples of the limited signal needed to achieve a identified desired confidence level; and an average frequency determiner circuit operative to determine an average frequency of the limited signal from the plurality of samples.

28. An apparatus according to claim 27, wherein the average frequency determiner circuit is operative to detecting a plurality of zero crossings of the limited signal occurring during a sampling interval, and to determine an average frequency of the limited signal from the detected plurality of zero crossings.

29. An apparatus according to claim 25, wherein the signal generator circuit comprises a switching circuit operative to connect a signal ground to the input of the bandpass filter in response to application of power to the receiver circuit.

30. An apparatus according to claim 29, wherein the switching circuit is further operative to disconnect the signal ground from the input of the bandpass filter and to connect the input of the bandpass filter to a radio signal path after adjustment of the bandpass filter.

* * * * *

UNITED STATES PATENT AND TRADEMARK OFFICE
CERTIFICATE OF CORRECTION

PATENT NO. : 6,631,265 B2 Page 1 of 1
DATED : October 7, 2003
INVENTOR(S) : Alan R. Holden et al.

It is certified that error appears in the above-identified patent and that said Letters Patent is hereby corrected as shown below:

<u>Column 8,</u>
Line 54, after "filter has a" insert -- passband --
Line 55, delete "passband".

Signed and Sealed this

Seventeenth Day of February, 2004

JON W. DUDAS
*Acting Director of the United States Patent and Trademark Office*